US011694895B2

(12) United States Patent
Robinson et al.

(10) Patent No.: US 11,694,895 B2
(45) Date of Patent: Jul. 4, 2023

(54) METHOD AND USE FOR LOW-TEMPERATURE EPITAXY AND FILM TEXTURING BETWEEN A TWO-DIMENSIONAL CRYSTALLINE LAYER AND METAL FILM

(71) Applicant: The Government of the United States of America, as represented by the Secretary of the Navy, Arlington, VA (US)

(72) Inventors: Jeremy T. Robinson, Washington, DC (US); Jose J. Fonseca Vega, Alexandria, VA (US); Maxim K. Zalalutdinov, Silver Spring, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 372 days.

(21) Appl. No.: 16/775,184

(22) Filed: Jan. 28, 2020

(65) Prior Publication Data

US 2020/0266061 A1 Aug. 20, 2020

Related U.S. Application Data

(60) Provisional application No. 62/805,658, filed on Feb. 14, 2019.

(51) Int. Cl.
*C30B 25/18* (2006.01)
*H01L 21/02* (2006.01)
(Continued)

(52) U.S. Cl.
CPC .......... *H01L 21/02609* (2013.01); *B32B 5/18* (2013.01); *B32B 9/007* (2013.01);
(Continued)

(58) Field of Classification Search
CPC ......... C30B 25/00; C30B 25/02; C30B 25/04; C30B 25/16; C30B 25/18; C30B 25/183;
(Continued)

(56) References Cited

U.S. PATENT DOCUMENTS

2016/0115032 A1   4/2016  Wodtke et al.
2016/0268061 A1*  9/2016  Wang ..................... C01G 45/02
2018/0277373 A1   9/2018  Meade et al.

FOREIGN PATENT DOCUMENTS

KR       20150077343 A  *  7/2015
KR      10-2015-0098180     8/2015
(Continued)

OTHER PUBLICATIONS

Kosinova, et al. publication entitled "Mechanisms of solid-state dewetting of thin Au films in different annealing atmospheres," Acta Materialia, vol. 83, pp. 91-101 (2015). (Year: 2015).*
(Continued)

*Primary Examiner* — Kenneth A Bratland, Jr.
(74) *Attorney, Agent, or Firm* — US Naval Research Laboratory; Stephen T. Hunnius

(57) ABSTRACT

A method of making a crystallographically-oriented metallic film with a two-dimensional crystal layer, comprising the steps of providing a metal film on a substrate, transferring a two-dimensional crystal layer onto the metal film and forming a two-dimensional crystal layer on metal film complex, heating the two-dimensional crystal layer on metal film complex, and forming a crystallographically-oriented metallic film with a two-dimensional crystal layer. A crystallographically-oriented metallic film with a two-dimensional crystal layer, comprising a substrate, a metal film on the substrate, a two-dimensional crystal layer on the metal film on the substrate, and a tunable microstructure within the porous metal/two-dimensional crystal layer on the substrate, (Continued)

wherein the metal film has crystallographic registry to the two-dimensional crystal layer.

5 Claims, 7 Drawing Sheets

(51) Int. Cl.

| | | |
|---|---|---|
| *B32B 15/16* | (2006.01) | |
| *B32B 9/00* | (2006.01) | |
| *H01L 33/18* | (2010.01) | |
| *B32B 5/18* | (2006.01) | |
| *B32B 15/20* | (2006.01) | |
| *B82Y 30/00* | (2011.01) | |

(52) U.S. Cl.
CPC .............. *B32B 15/16* (2013.01); *B32B 15/20* (2013.01); *H01L 21/0254* (2013.01); *H01L 21/02491* (2013.01); *H01L 21/02505* (2013.01); *H01L 21/02507* (2013.01); *H01L 21/02527* (2013.01); *H01L 21/02595* (2013.01); *H01L 21/02601* (2013.01); *H01L 33/18* (2013.01); *B32B 2260/04* (2013.01); *B32B 2264/107* (2013.01); *B32B 2305/026* (2013.01); *B32B 2307/514* (2013.01); *B32B 2307/704* (2013.01); *B32B 2307/732* (2013.01); *B82Y 30/00* (2013.01)

(58) Field of Classification Search
CPC ....... C30B 25/186; C30B 23/00; C30B 23/02; C30B 23/025; C30B 23/04; C30B 29/00; C30B 29/02; C30B 29/04; C30B 29/10; C30B 29/64; H02L 21/02609; H02L 21/02491; H02L 21/02505; H02L 21/02507; H02L 21/02527; H02L 21/0254; H02L 21/02595; H02L 21/02601; C23C 16/00; C23C 16/02; C23C 16/0209; C23C 16/0272; C23C 16/0281; C23C 16/06; C23C 16/22; C23C 16/26; C23C 16/27; C23C 14/00; C23C 14/02; C23C 14/024; C23C 14/025; C23C 14/06; C23C 14/0605; C23C 14/0611
USPC ........... 117/84, 88–89, 94, 97, 106, 928–929
See application file for complete search history.

(56) References Cited

FOREIGN PATENT DOCUMENTS

| WO | WO-2012086641 A1 * | 6/2012 | ............ B82Y 30/00 |
|---|---|---|---|
| WO | 2014-076613 | 5/2014 | |

OTHER PUBLICATIONS

Kosinova, Anna, et al. "Mechanisms of solid-state dewetting of thin Au films in different annealing atmospheres." Acta Materialia 83 (2015): 91-101.
Cao, Peigen, et al. "Preventing thin film dewetting via graphene capping." Advanced Materials 29.36 (2017): 1701536.
Blauth, Max, et al. "Coupling single photons from discrete quantum emitters in WSe2 to lithographically defined plasmonic slot waveguides." Nano letters 18.11 (2018): 6812-6819.
Krane, Nils, Christian Lotze, and Katharina J. Franke. "Moiré structure of MoS2 on Au (111): Local structural and electronic properties." Surface Science 678 (2018): 136-142.
Amit, Moran, et al. "Measuring Proton Currents of Bioinspired Materials with Metallic Contacts." ACS applied materials & interfaces 10.2 (2018): 1933-1938.
Liu, Yuan, et al. "Approaching the Schottky-Mott limit in van der Waals metal-semiconductor junctions." Nature 557.7707 (2018): 696-700.

* cited by examiner

METHOD AND USE FOR LOW-TEMPERATURE EPITAXY AND FILM TEXTURING BETWEEN A TWO-DIMENSIONAL CRYSTALLINE LAYER AND METAL FILM

REFERENCE TO RELATED APPLICATION

This application is a non-provisional of, and claims priority to and the benefits of, U.S. Provisional Patent Application No. 62/805,658 filed on Feb. 14, 2019, the entirety of which is herein incorporated by reference.

BACKGROUND

This disclosure concerns a method for the recrystallization and de-wetting of thin metal films with two-dimensional (2D) crystal over-layers.

The method enables the formation of: (i) strongly textured (crystalline) thin metal films with crystallographic registry to a 2D crystal overlayer, and (ii) networks of metallic pores and 2D crystals, termed an Oriented Porous mEtallic Network (OPEN) film.

The process involves transferring or depositing 2D crystal layers onto metal films and subsequent heat treatment in reductive atmospheres. The method is applicable to various combinations of transition metals, for example but not limited to Au, Ag, Ni, and Pd, and 2D layered crystals, for example but not limited to graphene, transition metal dichalcogenides, and hexagonal boron nitride. The 2D crystal layer/metal film complex can be considered a unit assembly and multiple units can be assembled and stacked using different 2D layer/metal film species.

The morphological properties and microstructure of the metal film, including film texture (crystalline) and de-wetted pore size are tunable. The metallic network of pores can serve as windows for optical, electrical or mechanical access.

Two-dimensional (2D) crystals integrated with interconnected metallic structural networks are of great interest due to their potential applications as catalysts, sensors and actuators, among others. The potential for these applications arrives from the high surface-area of the individual components, large variability of 2D crystals properties, and low resistivity of the metallic networks. The interconnected metallic networks are typically fabricated through traditional photolithographic methods or through the selective etching of a component in a metal alloy. The photolithographic method has the advantage of relying on well-known techniques and the capability of pre-design the exact structural morphology desired, including periodic structures. These methods can have some limitations based on the dimensions of the structural features and the materials compatibility, and also with increased network complexity there will also be an increase in the number of fabrication steps and cost.

The selective etching of a component in a metal alloy is a fabrication method capable of creating intricate three-dimensional (3D) networks with nanometer-scale features. The most common example would be the fabrication of nanoporous gold, where a gold-silver alloy film gets successfully de-alloyed and the silver etched away, all in a one-step acid bath. The resulting nanoporous film is, however, in a thermodynamically unstable state making it very susceptible to changes in temperature. At elevated temperatures (e.g., >300° C.), the metal grains rapidly coarsen enlarging the structural features of the network and the pores dimensions; in some cases, the 3D structure can collapse into a two-dimensional (2D) network, resembling a partially de-wetted metal thin film. The mechanism for the thermodynamic stabilization and morphology change of the nanoporous films is analogous to the thermodynamic stabilization and de-wetting behavior of as-deposited metallic thin films, discussed below.

The solid-state de-wetting of metal films is a phenomenon that has been studied at length. De-wetting is a process that is driven by surface energy differences between a deposited film and its support substrate. For example, in the case of a deposited metal film on a dielectric substrate, the deposited metal film is meta-stable and when heated, will re-arrange to form isolated metal islands to achieve energy minimization. The kinetics of this process is generally controlled by the self-diffusivity of the metallic atoms through the film surface, film-substrate interface and film grain-boundaries; in turn, the atomic diffusivity can be controlled with changes on temperature and on the local chemical environment of the film's surface. Traditionally, metallic adhesion layers like titanium and chromium have been employed to improve the adhesion of other metal films to their substrate and thereby preventing de-wetting or delamination. The annealing atmosphere on gold films has found that film de-wetting is enhanced on atmospheres that promote the reduction of the metal and desorption of other gas species.

The surface of a metal film can be partially or fully oxidized with the metal atoms residing at different oxidation states. The successful reduction of these oxidized metal atoms at the surface will enhance the atoms mobility and can promote film de-wetting. Inert atmospheres (e.g., Ar, $N_2$ and vacuum) are unable to reduce the surface oxides and can result in a retarded de-wetting process, and require higher annealing temperatures (e.g., above 400° C.) to achieve a similar de-wetting effect. Reductive atmospheres have resulted in mixed behaviors based on the reductive agent. Annealing in forming gas ($Ar+H_2$) resulted in the fastest de-wetting process (e.g., around 300° C.), while annealing in diluted carbon monoxide (Ar+CO) showed negligible gold diffusion even at higher temperatures (up to 600° C.). The partial reduction of gold was observed under the CO atmosphere; however the CO molecules chemisorbed to the gold surface preventing the diffusion of the surface atoms and film de-wetting.

2D crystal capping layers can be used to suppress the de-wetting of thin films, including polycrystalline metal films. After capping parts of the metallic films with 2D crystals, film de-wetting was only observed on the uncapped areas. This identified the high Young's modulus and surface conformity of 2D crystals as a method to prevent/suppress the surface fluctuations caused by large surface diffusion and grain growth, thus suppressing the film de-wetting. These annealing experiments were carried out at 350° C. in an inert nitrogen atmosphere.

When paired with metals, excitons in a 2D semiconductor can be advantageously utilized via coupling into surface plasmon-polariton (SPPs) modes and vice versa. This opens opportunities for energy routing between photon emission sites in 2D semiconductors for applications such as on-chip quantum light sources. In addition, metal nanostructures can lead to enhanced Purcell factors resulting in increased single-photon emission rates. In each of these cases, the quality of the 2DC/metal interface will play a central role in determining the ultimate performance of the device. A generalizable technique to fashion high-quality epitaxial 2DC/metal junctions could enable a wide range of applications for 2DCs in quantum information science and photonics.

Surface and interface quality are often decisive factors in the performance of engineered solid state devices. In the case of 2DC/metal junctions, assembly by transfer stacking (as opposed to direct metal deposition) reduces both chemical disorder and Fermi level pinning at the interface. Such devices can approach the Schottky-Mott limit for a van der Waals metal-semiconductor junction. Alternatively, 2DC/metal interfaces with crystallographic registry can be formed through van der Waals epitaxy. During physical vapor deposition, thin metal films tend to preferentially align on 2DCs, which results in periodic (Moiré) structural and electronic variations at the interface due to the lattice mismatch.

Here, we demonstrate a material platform that includes multiple aspects: aligned 2DC/metal interfaces, unique metal/2DC microstructure, and mechanical, vibrational, optical, and electrical coupling between and within the 2DC/OPEN film complex.

In this work, we exploit dewetting of 2DC/metal films to assemble structures that can be used for energy propagation and energy transfer between, for example, a 2D semiconductor and a metal film. The relative surface energy of a thin metal film on a substrate determines the driving force for wetting or dewetting. Despite being atomically thin, 2D materials significantly modify metal film dewetting due to their relatively high Young's Modulus, which suppresses surface fluctuations. We show here that under appropriate annealing conditions, the metal underlayer becomes highly textured and in crystallographic alignment with the 2DC overlayer, analogous to a reverse epitaxy process (or surface-templated epitaxy).

As dewetting initiates, pores form in the metal film while the 2DC overlayer either remains suspended above or coats the inside of the pores. We term this 2DC/metal framework an Oriented Porous mEtallic Network (OPEN) film. In this OPEN film geometry, simultaneous energy coupling into SPPs at pore sites occurs via the direct laser field and via the decay of excitons in the 2D semiconductor. The existence of pores enables significantly improved SPP coupling from in-plane exciton dipole moments (and vice versa), which do not in-couple/out-couple well on planar metal regions.

We subsequently observe energy out-coupling in the form of photoluminescence (PL), the intensity of which is well described by the expected SPP decay for each excitation wavelength. The porous metallic framework connects neighboring emitter sites located in the pores, creating an interconnected network of photon emitters.

SUMMARY OF DISCLOSURE

Description

This disclosure teaches methods for making and the products of crystallographically-oriented metallic films with two-dimensional crystal layers.

This disclosure concerns a method and product of the recrystallization and de-wetting of thin metal films with two-dimensional (2D) crystal over-layers.

The present invention is directed to a method of fabricating layered systems of thin metal films and 2D layered crystals with tunable microstructures.

The method and product concern: (i) strongly textured (crystalline) thin metal films with crystallographic registry to a 2D crystal overlayer, and (ii) networks of metallic pores and 2D crystals, termed an Oriented Porous mEtallic Network (OPEN) film.

The process involves transferring 2D crystals onto metal films and subsequent heat treatment in reductive atmospheres. The method is applicable to various combinations of metals, for example but not limited to Au, Ag, Ni, and Pd, and 2D layered crystals, for example but not limited to graphene, transition metal dichalcogenides, and h-BN.

The morphological properties and microstructure of the metal film, including film texture (crystalline) and de-wetted pore size are tunable. The metallic network of pores can serve as windows for optical, electrical or mechanical access. The 2D crystals on the OPEN metallic films can be fully suspended over the pores or coating the pore walls. The 2D crystal membranes can serve as a physical support surface for adlayers or nanoparticles, or can serve as a platform to implant or chemically modify the 2D crystal without substrate interference. The process can be repeated to build up heterojunctions of different metal/2D crystal materials, or can be transferred to other surfaces.

This disclosure provides details for two-dimensional crystal (2DC) overlayers influencing the recrystallization of relatively thick metal films and the subsequent synergetic benefits this provides for coupling surface plasmon-polaritons (SPPs) to photon emission in 2D semiconductors. We describe that annealing 2DC/Au films on $SiO_2$ results in a reverse epitaxial process where initially nanocrystalline Au films gain texture, crystallographically orient with the 2D crystal overlayer, and form an oriented porous metallic network (OPEN) structure in which the 2DC can suspend above or coat the inside of the metal pores. Both laser excitation and excitons in the 2DC semiconductor launch propagating SPPs in the OPEN film. Energy in-/out-coupling occurs at metal pore sites, alleviating the need for dielectric spacers between the metal and 2DC layer.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This disclosure teaches methods of making and structures for crystallographically-oriented metallic films with two-dimensional crystal layers.

This disclosure concerns a method for the recrystallization and de-wetting of thin metal films with two-dimensional (2D) crystal over-layers.

The method and product enables the formation of: (i) strongly textured (crystalline) thin metal films with crystallographic registry to a 2D crystal overlayer, and (ii) networks of metallic pores and 2D crystals, termed an Oriented Porous mEtallic Network (OPEN).

The process involves transferring 2D crystals onto metal films and subsequent heat treatment in reductive atmospheres. The method is applicable to various combinations of metals, for example but not limited to Au, Ag, Ni, and Pd, and 2D layered crystals, for example but not limited to graphene, transition metal dichalcogenides, and h-BN.

The morphological properties and microstructure of the metal film, including film texture (crystalline) and de-wetted pore size are tunable. The metallic network of pores can serve as windows for optical, electrical or mechanical access. The 2D crystals on the OPEN metallic films can be fully suspended over the pores or coating the pore walls. The 2D crystal membranes can serve as a physical support surface for adlayers or nanoparticles, or can serve as a platform to implant or chemically modify the 2D crystal without substrate interference. The process can be repeated to build up heterojunctions of different metal/2D crystal materials, or can be transferred to other surfaces.

The 2D crystal layer mediates mechanical, vibrational, electronic, and optical coupling between neighboring pores within the metal film, where the strength of the coupling is varied by pore configuration and 2D crystal mechanical properties.

We describe herein a method of fabricating heterostructures of thin metal films and 2D layered crystals with tunable microstructures where: (i) evaporated amorphous metal films can be transformed (ex-situ) into highly textured (crystalline) films on amorphous substrates, (ii) the thin metal films obtain a crystallographic registry over large areas induced by the 2D crystal over-layer, and (iii) the formation of porous metal films integrated with a 2D crystal over-layer, where the 2D crystal can be either suspended or coat the inside of the metallic pore.

Henceforth, we shall refer to the resulting metallic films with crystallographically-Oriented Porous mEtallic Networks as OPEN films. Uses for the OPEN films and 2D crystal heterostructures include electronic, optoelectronic and electromechanical structures and devices.

We have identified a way to control and tune the recrystallization and de-wetting behavior of a metallic film in direct contact with a 2D crystal.

Example 1

The metal film can be positioned/orientated between: (i) a substrate and a 2D crystal, (ii) on top of a 2D crystal layer, or (iii) between two 2D crystal layers.

Figure 1:
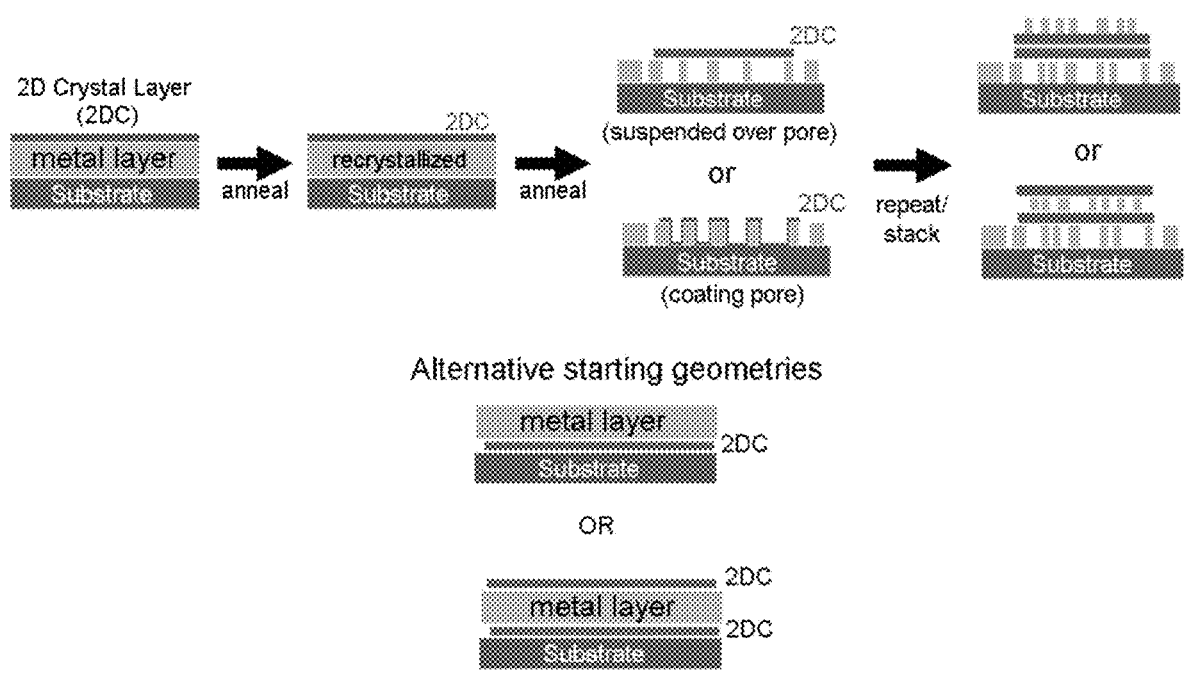
FIG. 1 illustrates an OPEN film fabrication process. Illustrated is a scheme of de-wetting process for metallic film capped with mechanically exfoliated or CVD-grown 2D crystal, followed by additional sequential/stacking steps. Note that the 2D crystal can be suspended over the metallic pore or collapse coating the pore. Also illustrated are alternative starting geometries for the de-wetting process with the metal film: on top of the 2D crystal and between two 2D crystals.
Figure 2:
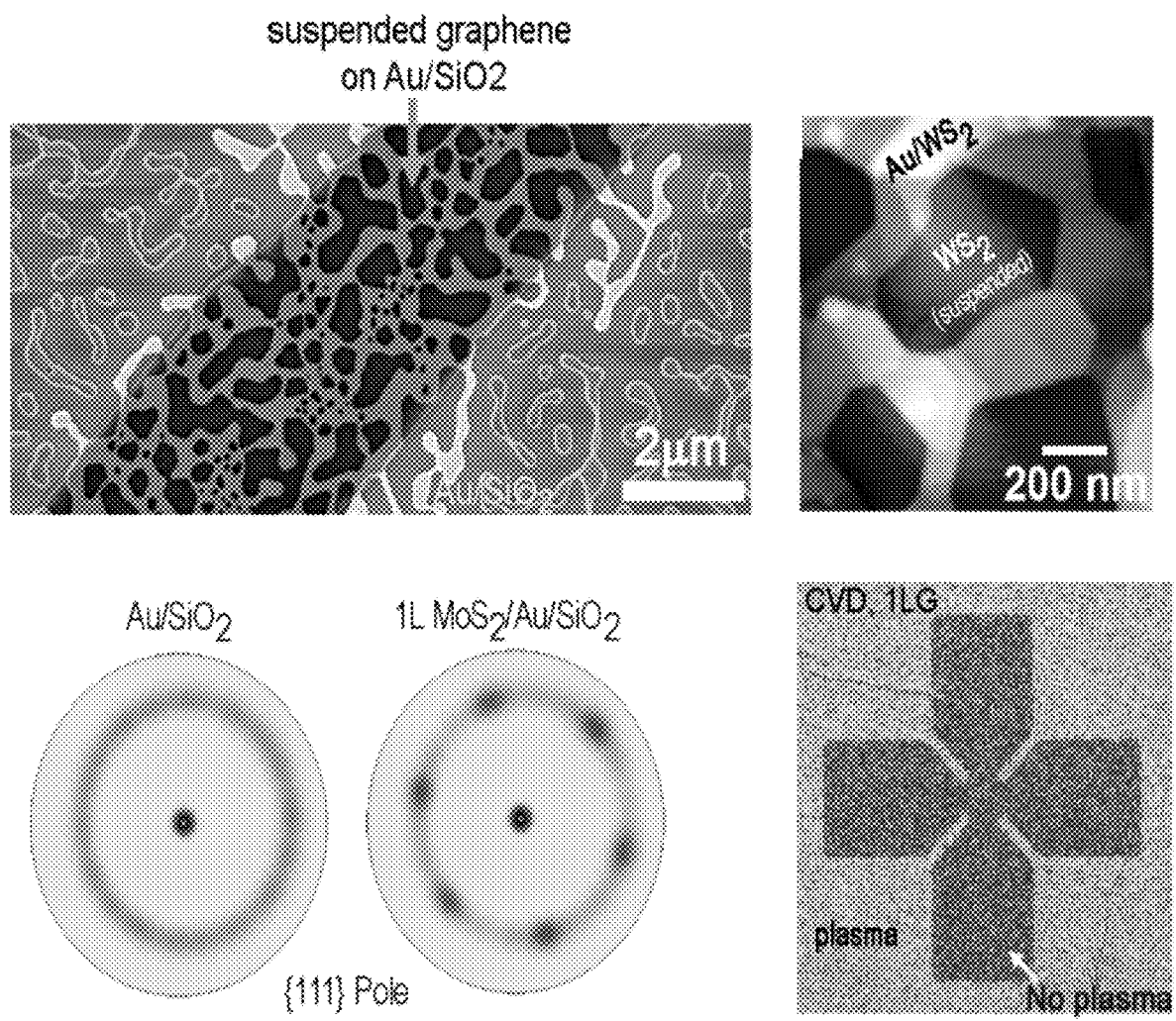
FIG. 2 illustrates various morphological aspects of the 2DC/metal film complex after annealing. Illustrated is a scanning electron microscopy image (top left) of a narrow graphene film on a gold layer that has been annealed and transformed into a porous metal film with suspended graphene membranes over the pores of the metal. (top right) Atomic force microscope (AFM) height image of pores in de-wetted gold film capped with single-layer $WS_2$. (bottom left) Electron backscatter diffraction (EBSD) measurements showing the pole plots along the {111} orientation for the 2DC/metal film complex after annealing MoS2/Au/SiO2 sample. After annealing, the gold layer re-crystallizes into two preferential in-plane orientations and becomes highly textured when it is covered by the MoS$_2$ layer. (bottom right) Optical image of a graphene/metal film complex in which the top graphene layer has been selectively exposed to oxygen plasma. Areas of the graphene/metal film complex that have not been exposed to the plasma treatment undergo the re-crystallization process, while regions that have been exposed to plasma have a limited transformation.

When the 2D crystal serves as the capping layer over the metal film, it can form suspended 2D crystal membranes over a metallic network of pores, as illustrated in FIG. 1 and shown in FIG. 2 with graphene over a gold film.

The 2D crystal membranes/metallic pores sizes can range from approximately a few nanometers (nm) to over a micron (µm).

FIG. 2 show the dimensions and topography from a single monolayer WS$_2$ membrane suspended over a gold pore.

Example 2

During the re-crystallization and de-wetting process, the metal grains preferentially re-orient themselves relative to the 2D crystal orientation, resulting in a strongly textured OPEN film (FIG. 2).

In this example, the gold {111} surface was found to preferentially recrystallize into two main in-plane orientations, rotated by 60° degrees. By selecting the appropriate gas ambient and annealing conditions, the morphology of the metallic pore network is controllable.

We have systematically identified different parameters for controlling the de-wetting and re-crystallization process, along with a variety of fabrication methods that could better adjust to the needs and constraints of a specific device assembly.

Example 3

OPEN Film Features
1. Fabrication method is applicable to various combinations of metals/2D layered crystals.
2. Fabrication method is compatible with numerous dielectric substrates.
3. No dielectric spacers required between the metal and 2D crystal.
4. Metal film thickness and 2D layer crystalline quality control the recrystallization and de-wetting energetics.
5. Continuous metallic network film.
6. The de-wetting of the metal under-layer opens windows of direct access to the 2D crystal and substrate.
7. Light-emitting 'pixels' are formed when the metal film dewets (or pore formation) from a semiconducting 2D crystal.
8. The suspended 2D crystal membranes have tunable stress based on de-wetting conditions.
9. The metal layer recrystallizes over the area in contact with the 2D crystal.
10. The metal film is in crystallographic registry with the 2D crystal lattice.

Example 4

Basic Operation

The most basic unit for the fabrication of the OPEN film structures consists of a 2D crystal on top of a thin metallic film deposited onto a substrate, such that film recrystallization is promoted by the 2D crystal layer and that the metal de-wetting is promoted by surface energy differences of either the substrate and/or 2D crystal layer.

Film de-wetting occurs when two conditions are met: (1) the total free energy decreases by reducing the metal's surface and interfacial areas (pore surface area); and (2) the total free energy lost in (1) is greater than the total free energy gained by forming new metal surfaces perpendicular to the substrate (pore walls). In the absence of a 2D crystal overlayer, the first requirement is achieved when the combined metal surface energy parallel to the substrate ($\gamma_{metal}$) and interfacial surface energy between the metal film and the substrate ($\gamma_{interface:m-s}$) are larger than the substrate surface energy ($\gamma_{substrate}$) (i.e., $\gamma_{metal}+\gamma_{interface:m-s}>\gamma_{substrate}$). This modifies to: $\gamma_{interface:2D-m}+\gamma_{interface:m-s}>\gamma_{substrate}+\gamma_{2D}$, when the metal film is capped with a 2D crystal; where $\gamma_{interface:2D-m}$ is the interfacial surface energy between the 2D crystal and metal film, and $\gamma_{2D}$ is the 2D crystal surface energy.

Example 5

An example of a fabrication approach includes:

(1) Deposited a metallic film (for example but not limited to Au, Pd, Ni, Ag) ranging in thickness from approximately 5 nm-100 nm. Dielectric substrates (e.g., $SiO_2$, glass, PMMA, etc.) are the most typical example of substrate materials meeting the surface energy requirements outlined above.

(2) Transferred or deposited a 2D crystal (e.g., graphene, transition metal dichalcogenide, or boron nitride) that is one or more layers thick onto the metal film. The 2D crystal can be deposited/transferred using a variety of techniques, including: (i) direct stamping or exfoliation method, or (ii) using a liquid-based transfer where the 2D crystal, supported by a polymer film, floats on the water surface and is then re-captured and dried onto a metal film, or (iii) drop-cast/spin-cast from solution exfoliated sources.

(3) The complete film stack was annealed in an atmosphere that contains a mixture of at least a few percent hydrogen gas and an inert gas (e.g., $Ar+H_2$), where the annealing time and temperature will depend on the metal species, metal thickness and the targeted degree of de-wetting (i.e., metal pore size). The resulting metal film will recrystallize into a strongly textured (crystalline) film. As the annealing temperature is increased, the microstructure can transform into an interconnected metallic pore structures that have a surface coverage ranging between approximately 0%-60% of the planar surface area, while the 2D crystal remains suspended above the pores.

With additional heat treatment, the suspended 2D crystals can collapse to coat the inside of the metallic pores.

Example 6

2D Crystals

The fabrication method presents the versatility of universally working with different 2D crystals and thin metal films. We have demonstrated the de-wetting behavior when capping the metal film with both chemical vapor deposition (CVD) grown and exfoliated graphene, mechanically-exfoliated transition-metal dichalcogenides with chemical composition $MX_2$, where M=W, Mo and X=S, Se, and Te, metal-organic CVD grown $(Mo,W)S_2$ alloys, and hexagonal boron nitride (h-BN), see FIG. 3 for additional examples.

All 2D crystals that are stable under thermal treatments in inert atmospheres and hydrogen are compatible with the process.

Specifics of the de-wetting morphology are influenced by the number of layers (i.e., 2D crystal film thickness) and crystalline quality of the 2D crystal. That is, the recrystallization and de-wetting efficiency is tunable with increasing defect density in the 2D crystal.

For example, in FIG. 2, by treating the top surface of a 2D crystal with oxygen plasma to promote defect formation, we found that the underlying metal film does not efficiently de-wet and recrystallize. This effect can be used to further engineer the recrystallization and de-wetted metallic pore network using lithographic techniques.

Example 7

Metal Film

Gold is a commonly used material for metallic contacts in device fabrication; nonetheless there are numerous other metals with unique properties that are used or proposed for use in a range of applications. These properties can include low contact-resistance or increased conductivity of a metal interconnect, surface plasmonics, and chemical reaction catalysts, among others. Given that the re-crystallization and de-wetting process is due to the minimization of surface and interfacial energies, and controlled by the surface-diffusion kinetics, it is to be expected that different metallic films will have different re-crystallization and de-wetting behavior under nominally similar conditions.

There are three primary categories in which we can differentiate metallic films that will affect the de-wetting process: chemical composition (e.g., alloying), microstructure (e.g., deposition rate and thermal history) and film thickness. Metallic elements can have different crystal structures, bond strengths and chemical stabilities/reactivities, all major factors that influence their surface/interfacial energies and atomic self-diffusion properties.

Figure 3:
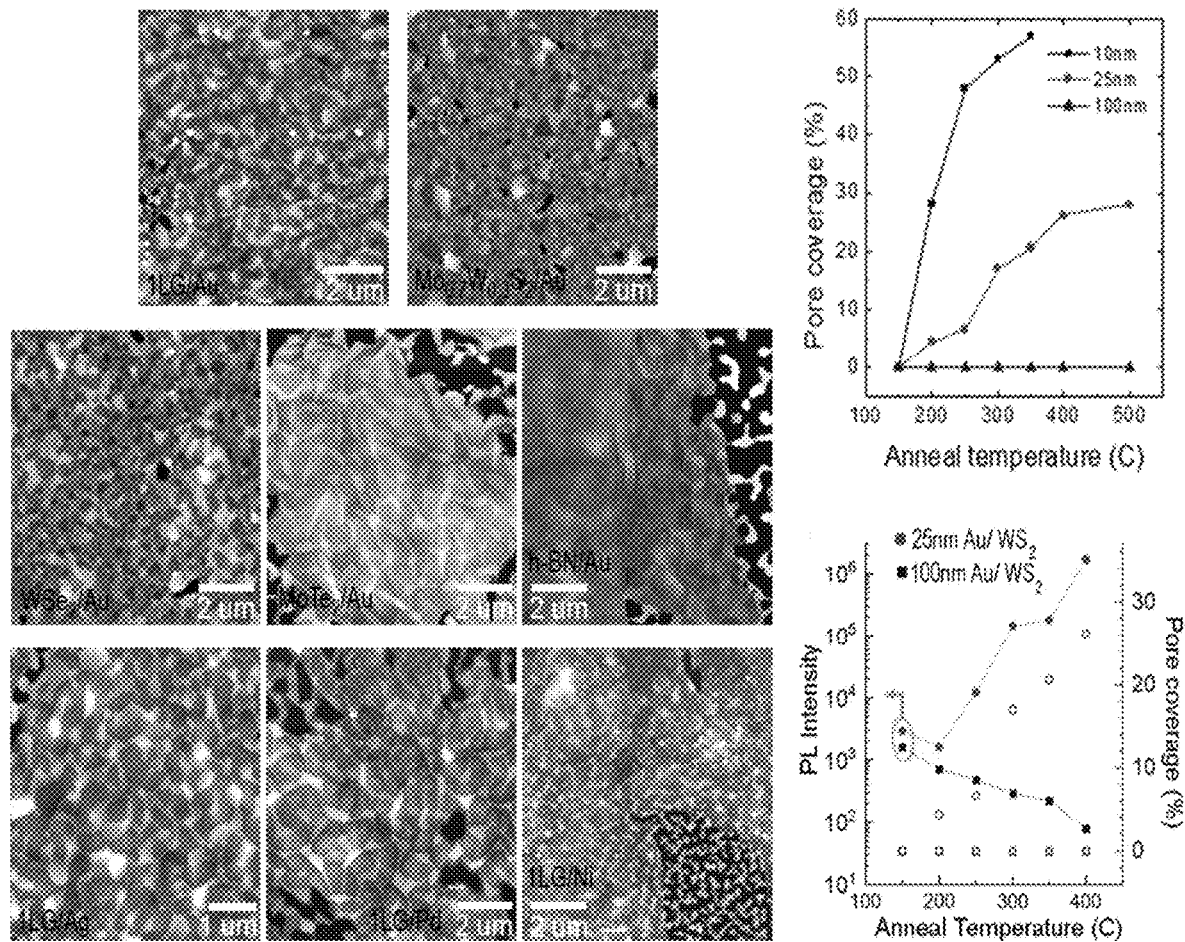
FIG. 3 illustrates the implementation of different material combinations for the 2D crystal layer/metal film complexes. (left images) AFM height scans of different metals capped with different 2D crystals. These include: graphene on Au, Mo$_{0.7}$W$_{0.3}$S$_2$ on Au, WSe$_2$ on Au, MoTe$_2$ on Au; h-BN on Au, graphene on Ag, graphene on Pd, and graphene on Ni. (top right) Plot showing the effect of metal film thickness on the recrystallization and de-wetting behavior of gold, where the percentage of surface pore coverage increases with thinner metal films. (bottom right) Example of increased light emission (photoluminescence) from a semiconducting 2D crystal layer as the metal pore density increases.

For example, under similar experimental conditions we observed the following order for the de-wetting temperature onset of different face-center cubic (FCC) metals: silver<gold<nickel<palladium<nickel<platinum. FIG. 3 illustrates the resulting de-wetting of some of these metals capped with CVD-grown graphene.

Metallic film microstructure also plays a role in the de-wetting behavior, as it can be seen as an indication of its thermodynamic stability. Amorphous and small-grain films will be comparatively more unstable than highly crystalline films with larger grains. Similarly, well-oriented/textured films will adopt low-energy surfaces minimizing their overall film energy. Therefore, films deposited with short-range crystallinity, or nanocrystalline (i.e. rapid and low-temperature deposition) will be more thermodynamically unstable and with larger de-wetting potential. Lastly, the film thickness influences the de-wetting process; de-wetting of thicker films generates larger areas of metallic vertical surfaces (pore walls), rapidly increasing the total surface energy of the de-wetted structure. To minimize the increase in surface energy, thicker films exhibit sluggish de-wetting with a decrease in pores density and sizes.

This results in thinner films recrystallizing and de-wetting faster, at lower temperatures and to a higher degree than thicker films. We have demonstrated this effect for gold films of 10 nm, 25 nm and 100 nm thick, shown in FIG. 3. For a 10 nm thick gold film, considerable de-wetting was observed after annealing 15 min at 200° C. 28% de-wetted area), while similar de-wetting would be achieved only after annealing 15 min above 400° C. for a 25 nm gold film. In turn, no de-wetting was observed in gold films 100 nm thick after annealing up to 500° C. Thicker gold film are therefore useful for designing areas without de-wetting.

Example 8

Substrate

The substrate selection is another key parameter in the de-wetting behavior of a metal film. The higher the interfacial energy between the film and the substrate, the larger the de-wetting degree expected, as described earlier. Some of the substrate properties that are relevant for integrating the de-wetted structures include substrate transparency, flexibility, and thermal stability up to and above 200° C.

Example 9

Annealing Conditions

The annealing atmosphere plays an important role in the re-crystallization and de-wetting process. Even noble metals like gold can partially oxidize at the surface, which affects how the surface-atoms diffuse and thus, the resultant re-crystallization and de-wetting kinetics.

We have found a measurable effect of the annealing atmosphere by treating identical samples to different chemical environments.

Figure 4:
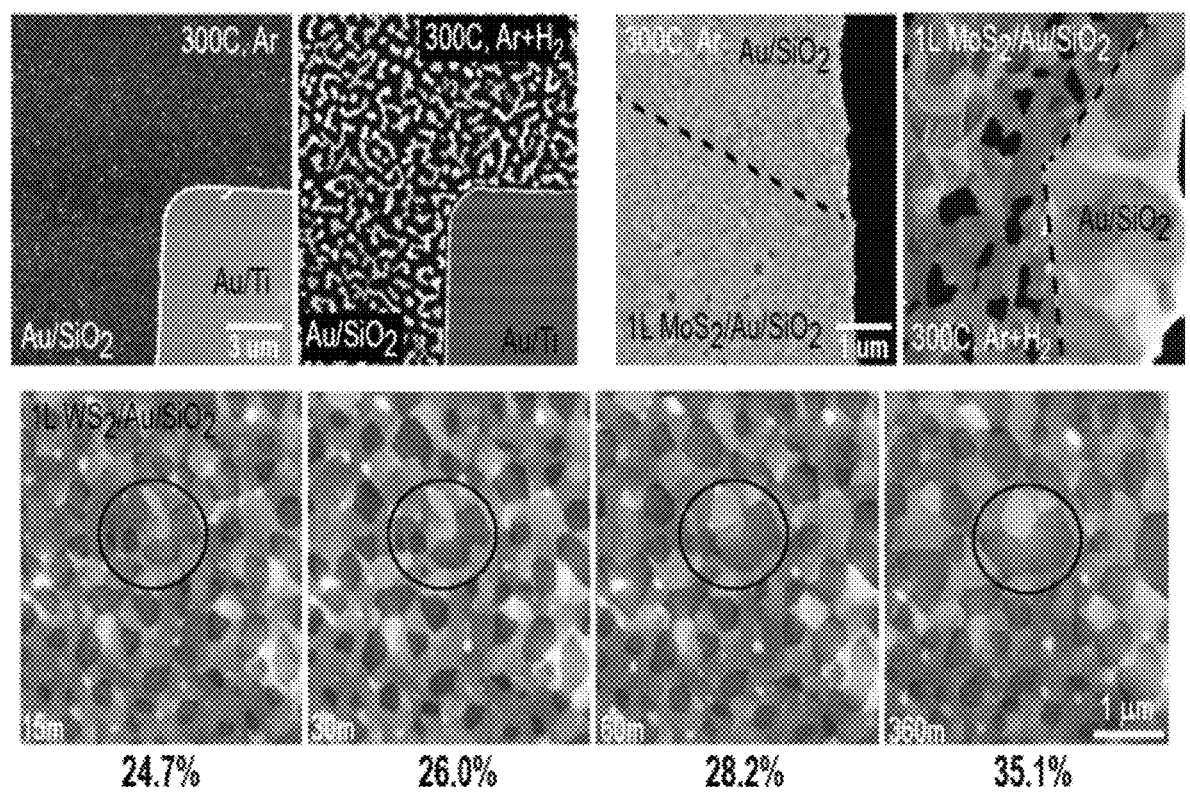
FIG. 4 illustrates the effect of annealing conditions on the morphology of the 2DC/metal film complex. AFM height scans showing the difference in metal de-wetting behavior when using an inert argon gas only or a reductive Ar+H$_2$ gas mixture (top left). Similarly, now with a MoS$_2$ overlayer (top right). (bottom) AFM height scans of the growth progression of gold pores with a WS$_2$ overlayer. The percentages of pore surface area coverage are labeled beneath each image.

From FIG. 4, it was observed that when annealing in a purely inert environment (e.g., Ar at 300° C.), minimal de-wetting of the metal was observed either in the 2D crystal capped or uncapped regions. Conversely, a large degree of re-crystallization and/or de-wetting was observed in both capped and un-capped regions after annealing for the same period of time and temperature in the presence of hydrogen gas (e.g., Ar+$H_2$). This extra level of control allows for the use of additional heating steps during device fabrication without further film de-wetting when not desired.

The careful selection of the appropriate annealing time and temperature allows for the precise control of the resulting structure morphology. Lower annealing temperatures at longer annealing times can result in improved strain relaxation in the 2D crystal, which translates to higher percentage of unbroken 2D crystal membranes.

For example, we found that for a 25 nm thick gold film annealed in a Ar+$H_2$ atmosphere between 250-350° C. is an condition that leads to a large fractional area (or percent area) that the metal film de-wets beneath a 2D crystal over-layer, while maintaining a high fraction of suspended 2D crystal over the pores in the metal film. Under these conditions, from FIGS. 3 and 4, we note a de-wetting control of up to over 35% pore/membrane coverage area. FIG. 4 shows the growth and coalescence of pores in the gold film after prolonged annealing within this temperature range; some pores were measured to grow over a micron in length.

Example 10

Here we report how two-dimensional crystal (2DC) over-layers influence the recrystallization of relatively thick metal films and the subsequent synergetic benefits this provides for coupling surface plasmon-polaritons (SPPs) to photon emission in 2D semiconductors.

We show that annealing 2DC/Au films on SiO2 results in a reverse epitaxial process where initially nanocrystalline Au films gain texture, crystallographically orient with the 2D crystal overlayer, and form an oriented porous metallic network (OPEN) structure in which the 2DC can suspend above or coat the inside of the metal pores.

Both laser excitation and excitons in the 2DC semiconductor launch propagating SPPs in the OPEN film.

Energy in-/out-coupling occurs at metal pore sites, alleviating the need for dielectric spacers between the metal and 2DC layer.

At low temperatures, single-photon emitters (SPEs) are present across an OPEN-$WSe_2$ film, and we demonstrate remote SPP-mediated excitation of SPEs at a distance of 17 μm.

Example 11

The controlled dewetting and recrystallization of metal films with two-dimensional (2D) crystal over-layers enables the formation of highly textured metallic films, together with a network of metallic pores and suspended 2D crystal membranes.

Mechanically-exfoliated, chemical-vapor deposited (CVD-grown), and/or, metal-organic chemical vapor deposited (MOCVD-grown) 2D crystals (examples include but are not limited to, graphene, h-BN, and transition-metal dichalcogenides (TMDs)) were transferred on top of metallic thin films on SiO2/Si substrates to modify the dewetting and recrystallization dynamics.

After heat treatment, metal films capped with 2D crystals became textured and formed pores that span up to 60% of the planar surface area, depending on annealing conditions and 2D crystal quality.

The network of suspended membranes was found to have significantly different optical and electronic properties than the supported regions.

For example, enhancement in photoluminescence of nearly three orders of magnitude and spatial surface potential variations up to 300 mV.

The process capabilities were exemplified through a series of heterostructures of different metal/2D crystal materials where the resulting properties highlighted the influence of the networked topography.

Example 12

Luminescent defects in 2D semiconductors hold promise for applications in photonics and quantum communication. For instance, strain-induced defects in WSe2 have attracted attention as narrow line-width single photon sources. Herein is presented a series of low-temperature photoluminescence (PL) microscopy studies on networks of suspended 2D crystal membranes formed by controlled dewetting and recrystallization of an underlying metal film.

For monolayer membranes of WSe2 and heterojunctions of WSe2/MoS2 formed on a porous Au film, we found a strong (1000×) enhancement of PL intensity from the suspended regions, as well as the appearance of relatively sharp (<1 meV) emission lines.

The crystallographic texturing of the metal under-layer also lent itself to low-loss propagation of surface plasmon polaritons (SPP), offering a means for energy transfer between discrete luminescent centers.

We used a split excitation/collection imaging approach to characterize nonlocal luminescence in this unique material system, and discussed the outlook for studying networks of interconnected defects in 2D materials.

Advantages and Features

The OPEN films proposed here have several advantages that can prove useful for applications. (1) The formation of large-area, strongly textured (crystalline) thin metal films on amorphous substrates using ex-situ low temperature processing, and (2) the formation of suspended 2D crystal membranes, which is a notoriously challenging task due to the thinness of the layers (~0.4-1.0 nm per layer) and their vulnerability to damage from conventional processing techniques when suspended.

In the fabrication process outlined here, thin-film stacks of metals and 2D crystals are formed as fully supported layers, and then a thermal treatment step forms the OPEN film structure and suspended 2D crystal membranes over large areas.

No other known process exists that can form large area networks of crystallographic aligned metallic pores together with suspended 2D crystals membranes.

The proposed structure greatly simplifies the fabrication procedure for suspended 2D crystal membranes, which reduces the fabrication steps and cost. In the absence of an adhesion layer, the metallic film can be de-wetted/recrystallized directly on the device being fabricated or on a separate substrate followed by a transfer step onto the device. This gives additional versatility to the fabrication process, avoiding the unnecessary anneal of devices that might be susceptible to higher temperatures.

The quality of the 2D crystal influences the de-wetting process, as previously discussed. This is correlated with the metal film recrystallization as it de-wets and pores open. Metals with FCC structure tend to preferentially recrystallize with an {111} out-of-plane orientation, matching the hexagonal symmetry of 2D crystals. Preferential in-plane orientation has also been observed for certain metals, adding an additional degree of order to the de-wetted structures.

The structural/morphological complexity of the de-wetted structures can be increased in several ways.

Figure 5:
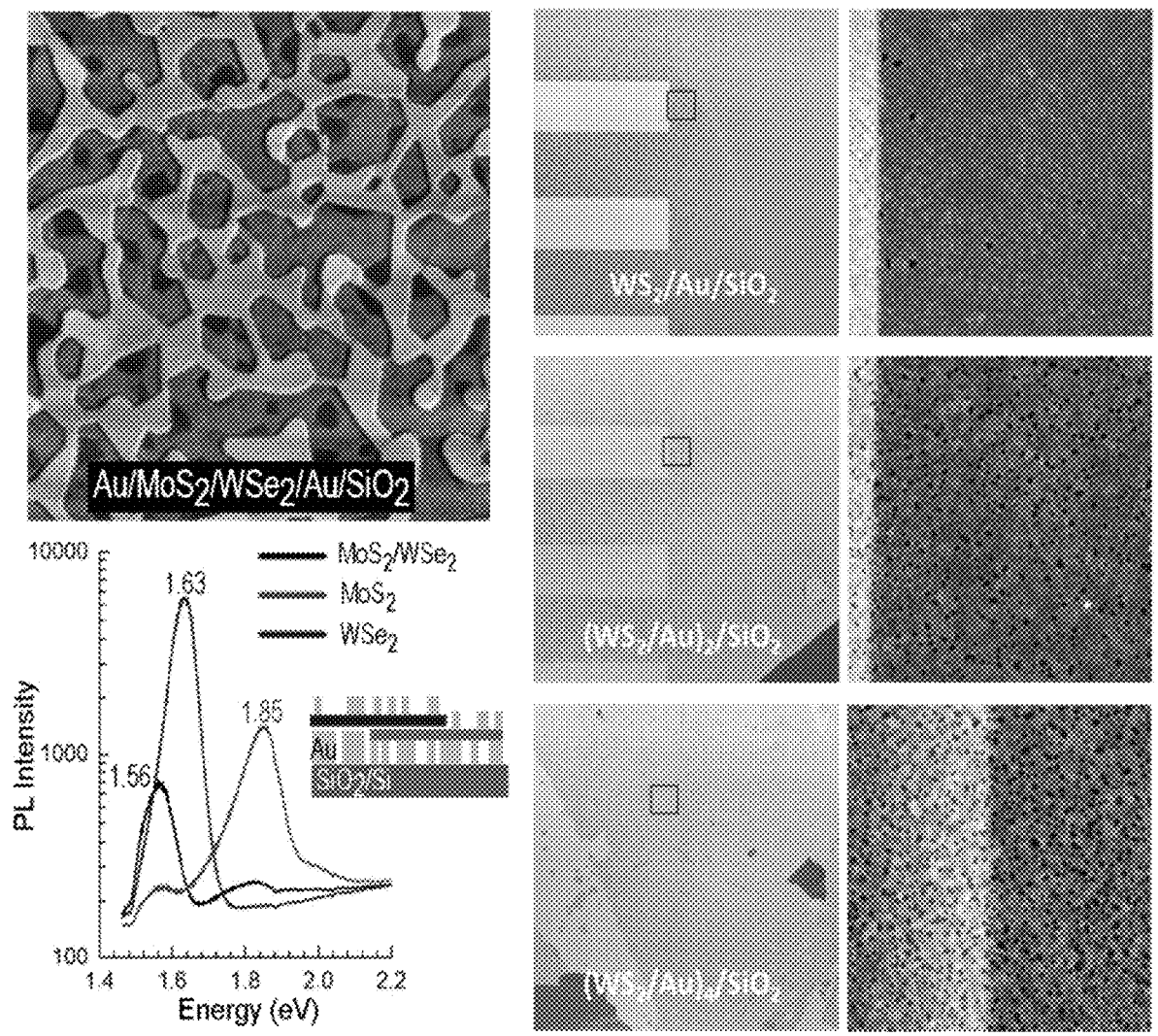
FIG. 5 illustrates the assembly, morphology, and optical response of multiple stacked 2DC/metal film complexes. (top left) AFM height image of a sandwiched 2DC/metal film heterostructure composed of Au/MoS$_2$/WSe$_2$/Au. (bottom left) Light emission (photoluminescence spectrum) from the heterostructure complex is shown for the MoS$_2$ and WSe$_2$ monolayers, and the overlapped region with the interlayer exciton light emission. (right images) Optical images and AFM height scans of OPEN film multi-layer assemblies: (top right) first WS$_2$/OPEN Au layer, (middle right) second WS$_2$/OPEN Au layer, and (bottom right) fourth WS$_2$/OPEN Au layer.

For example, the sequential transfer and vertical stacking of OPEN films can give a new three-dimensional component to the metallic pore network/2D crystal membranes, in the form of stacked superstructures, as suggested in FIG. 1. FIG. 5 shows the successful fabrication of a 2D-crystal vertical heterostructure "sandwiched" between two OPEN gold films. The high-quality interface between the two 2D crystal semiconductors—$MoS_2$ and $WSe_2$—was assessed by the measurement of the interlayer excitonic emission observed in FIG. 5.

On the other hand, FIG. 5 shows the sequential stacking and de-wetting of 2D-crystal/metal-film assemblies, up to four times. Alternatively, a surface can be selectively patterned with adhesion layers, such that some regions de-wet while other regions do not, see FIGS. 4 and 6. As outlined earlier, the 2D crystal quality, the substrate and the metal-film thickness can also be used to tune the de-wetting process; thus, the successful modification of any of these components in specific areas—through lithographic steps—can lead to areas with noticeably distinct de-wetting behavior. The combination of these methods allows for the design of specific features and patterns of de-wetted structures in a metallic film.

The large combination of materials available to carry out the described method (i.e. choice of metal film, substrate and 2D crystal), expands its possible integrations and applications. Examples of the potential use of the system of re-crystallized and/or de-wetted metallic film/2D crystal membranes are: as porous electrical contacts with windows to allow light to pass through; as high surface-area electrodes for catalysis; as structural platforms for suspended 2D crystal membranes, or as low-resistance metallic interconnects. Other metal-specific applications can also be envisioned, for example, as substrates for self-assembling biological molecules (gold) and electrodes for protonic devices (palladium). While the only required property for the substrate is to have a different (and larger) interface-energy that will help drive metal film de-wetting, additional properties could also be exploited, for example electronic (conducting vs. insulating), optical (transparent vs. opaque) and mechanical (rigid vs. flexible).

Figure 6:
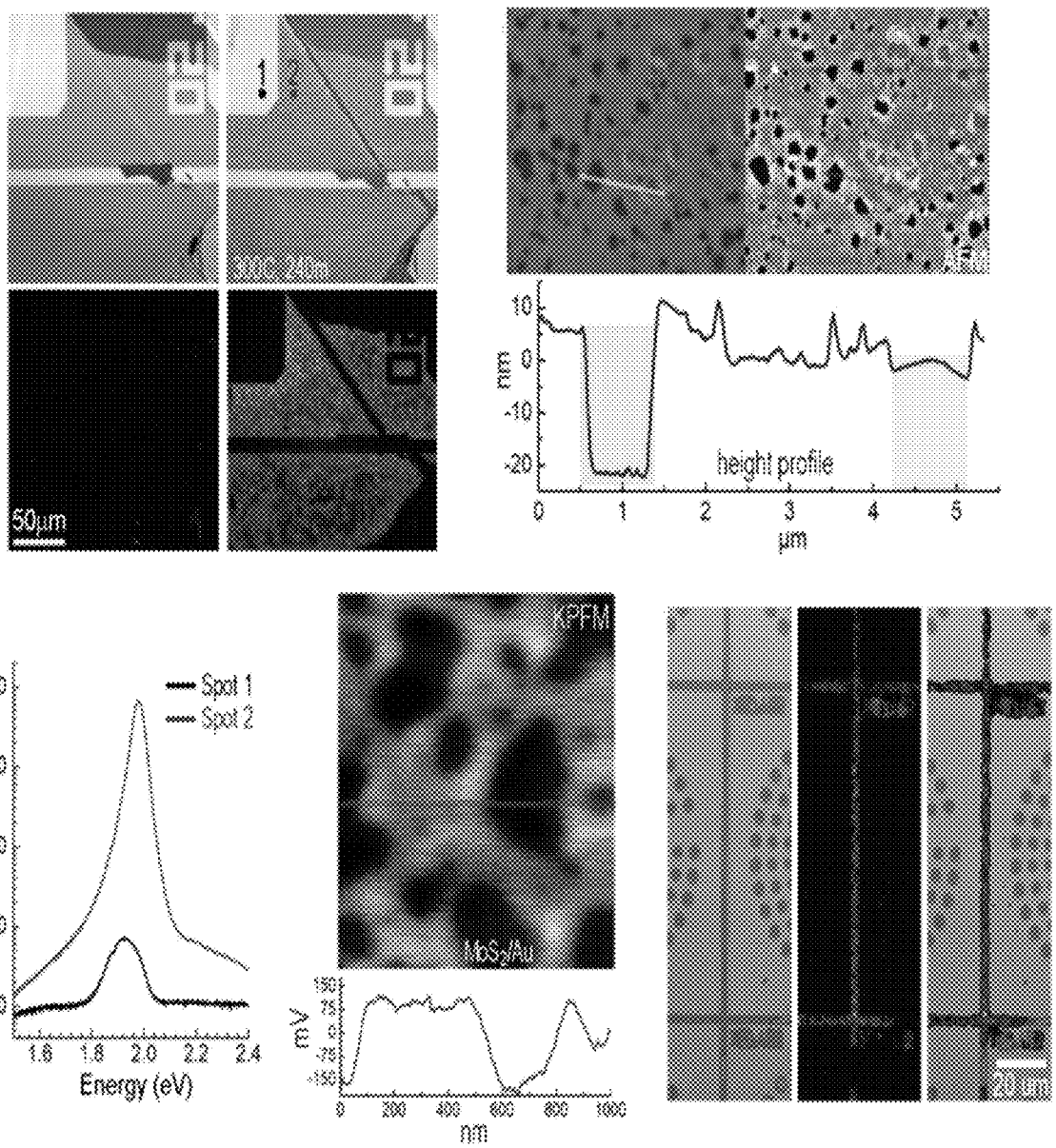
FIG. 6 illustrates advantages of the 2DC/metal film complex. Enhancement of photoluminescence and fluorescence emission from semiconducting 2DC layer/metal film complex. Optical and fluorescence images of single-layer WS$_2$ over gold film before and after annealing. Overlaid optical and fluorescence images, AFM height scan, and height profile of line scan, associating a suspended WS$_2$ membrane over a gold pore with enhanced light emission. Photoluminescence (PL) spectra of spots 1 and 2 shown, PL intensity is up to three orders of magnitude higher over the suspended WS$_2$ membranes. Surface potential of MoS$_2$ suspended over porous metal film obtained by kelvin probe force microscopy. Surface potential of suspended MoS$_2$ is about 300 mV lower than MoS$_2$ supported on gold. Optical, fluorescence and overlaid images of site-specific de-wetting of gold film capped with WS$_2$.

The large spectrum of electronic, optical and mechanical properties of the 2D crystals is of particular interest for the design and fabrication of new electronic, optoelectronic and electromechanical devices. By selecting a particular 2D crystal, these properties can be easily selected after the de-wetting process is completed. For example, we have demonstrated distinctly different properties between the suspended 2D crystals and the supported 2D crystals on the re-crystallized and de-wetted metals. Radiative recombination on the suspended semiconductor monolayer membranes is significantly enhanced. FIG. 6 shows the increase in fluorescence emission over the suspended $WS_2$ membranes after annealing. FIG. 6 shows how the observed fluorescence comes almost exclusively from the suspended monolayer membranes and not from broken membranes or supported $WS_2$ on the thin gold metal film. The radiative emission was found to be three to four orders of magnitude more intense over the suspended monolayer membranes, as determined through photoluminescence (PL) in FIGS. 3 and 6. In addition, local work function variations in the 2D crystals between the suspended membranes and metal-supported regions were also measured, as shown in FIG. 6, indicating local differences in doping level and chemical potential.

The combination of area-specific/deterministic de-wetting processes and the variation of properties between suspended and supported regions, leads to the development of novel mechanical/vibrational or optoelectronic structures and devices, as demonstrated in FIG. 6. The suspended 2D crystal membranes over the porous metallic network serves as platforms for applications of several optical phenomena, including: waveguides, localized light emission from 2D semiconductors, long-range energy propagation through the metal framework (e.g., via surface plasmon polaritons), mechanical, acoustic or vibrational actuation of the suspended 2D crystal membranes and/or suspended porous gold regions, among others.

Figure 7:
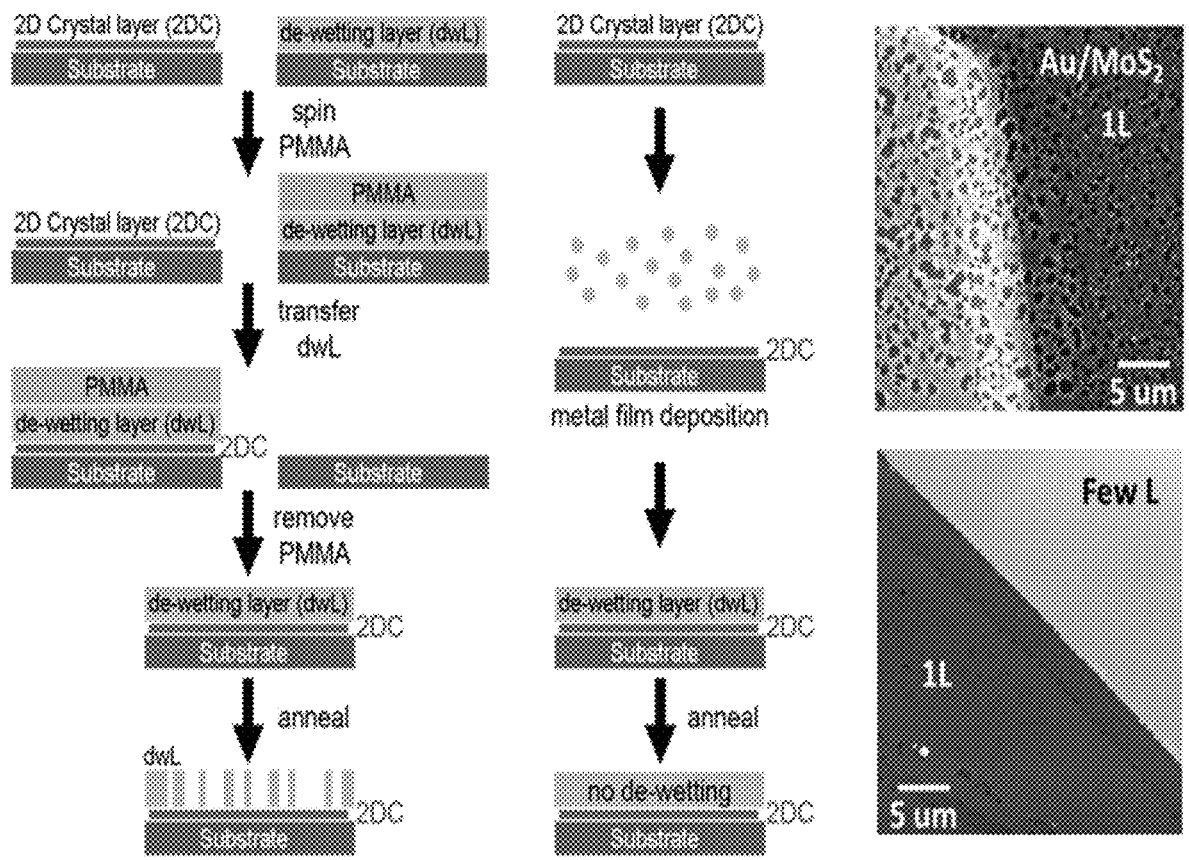
FIG. 7 illustrates a reverse geometry (metal film/2DC layer) for OPEN film complex. Scheme for top-metal transfer process. Scheme for top-metal deposition process. AFM height scans of gold films on top of MoS$_2$ after annealing at 300° C.: de-wetted transferred film prepared as shown, and deposited film prepared as shown.

A primary advantage of the proposed OPEN films fabrication method is the versatility in material combinations (metal films and 2D crystal layers) that are compatible with the re-crystallization and de-wetting process. We have developed alternative procedures to assemble metal/2D crystal layers for de-wetting, which utilize the deposition of the metal films onto sacrificial layers (e.g., polymer substrates such as PMMA, PVA, PDMS etc.) that can be transferred to any surface. Metal films can exhibit better adhesion to the polymer substrates—as compared to harder solid-state materials like Si, $SiO_2$, glass, etc.—allowing the direct exfoliation of large-area monolayer 2D crystals. This results in large areas of de-wetted metal and suspended 2D crystals for the simple integration into devices. The deposition of the metal film on a sacrificial transfer-substrate allows for the joint transfer of the 2D crystal/metal film assembly to a new substrate prior annealing. It also permits the fabrication of an assembly with the OPEN film on top of the 2D crystal (FIG. 7), ideal for the fabrication of vertical heterostructures with top metal contact, as previously shown in FIG. 5. We note that when a metal film is directly evaporated onto a 2D crystal (FIG. 7) it can produce defects, which can result in poor or no de-wetting of the metal film. FIG. 7 shows the difference in de-wetting behavior between a transferred and an e-beam deposited top gold film.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A method of making epitaxy and film texturing between a two-dimensional crystal layer and metal film, comprising the steps of:

providing the metal film on a substrate;
wherein the metal film comprises a thickness from 1 nm to 200 nm on the substrate;
wherein the metal film comprises one selected from the group consisting of Au, Ag, Ni, Pd, Pt, Cu, W, Mo, and Cr;
transferring or depositing the two-dimensional crystal layer onto the metal film and forming a two-dimensional crystal layer on metal film complex;
wherein the two-dimensional crystal layer comprises a thickness from one monolayer to 100 layers;
wherein the two-dimensional crystal layer comprises one selected from the group consisting of graphene, transition metal dichalcogenides, and hexagonal boron nitride;
heating the two-dimensional crystal layer on metal film complex; and
forming a first epitaxy and film texturing between the two-dimensional crystal layer and metal film;
wherein the first epitaxy and film texturing between the two-dimensional crystal layer and metal film comprises a textured porous metallic film;
wherein the textured porous metal film crystallographically orients with the two-dimensional crystal layer; and
wherein the two-dimensional crystal layer is suspended over and/or
wherein the two-dimensional crystal layer is within the pores
of the textured porous metallic film.

2. The method of making epitaxy and film texturing between the two-dimensional crystal layer and the metal film of claim 1,
wherein the textured porous metallic film with the two-dimensional crystal layer comprises tunable microstructures.

3. The method of making epitaxy and film texturing between the two-dimensional crystal layer and metal film of claim 1,
wherein the step of heating the two-dimensional crystal layer on metal film complex is in a reductive atmosphere comprising hydrogen and an inert gas mixture;
wherein the two-dimensional crystal layer mediates mechanical, vibrational, optical, and electrical coupling between pores within the textured porous metal film; and
wherein the strength of the coupling is varied by pore configuration and the two-dimensional crystal layer properties.

4. The method of making epitaxy and film texturing between the two-dimensional crystal layer and metal film of claim 1, further comprising the steps of:
transferring or depositing a second metal film on the two-dimensional crystal layer on the metal film on the substrate;
transferring or depositing a second two-dimensional crystal layer on the second metal film on the two-dimensional crystal layer on the metal film on the substrate and forming a second two-dimensional crystal layer on metal film complex;
heating the second two-dimensional crystal layer on metal film complex; and
forming a second epitaxy and film texturing between the second two-dimensional crystal layer and the second metal film.

5. The method of making epitaxy and film texturing between the two-dimensional crystal layer and metal film of claim 4, further comprising the steps of:

functionalizing by adlayers or nanoparticles the first epitaxy and film texturing between the two-dimensional crystal layer and metal film and/or the second epitaxy and film texturing between the second two-dimensional crystal layer and the second metal film.

\* \* \* \* \*